United States Patent [19]
Kunz et al.

[11] Patent Number: 4,707,659
[45] Date of Patent: Nov. 17, 1987

[54] METHOD AND DEVICE FOR DETERMINING AN NMR DISTRIBUTION IN A REGION OF A BODY

[75] Inventors: Dietmar W. Kunz, Hamburg, Fed. Rep. of Germany; Hans H. Tuithof; Johannes J. M. Cuppen, both of Eindhoven, Netherlands

[73] Assignee: U.S. Philips Corporation, New York, N.Y.

[21] Appl. No.: 729,007

[22] Filed: Apr. 30, 1985

[30] Foreign Application Priority Data

May 2, 1984 [NL] Netherlands ......................... 8401382
Sep. 18, 1984 [NL] Netherlands ......................... 8402855

[51] Int. Cl.⁴ .......................................... G01R 33/20
[52] U.S. Cl. .................................... 324/309; 307/268; 324/310; 324/322
[58] Field of Search ............... 324/309, 310, 307, 312, 324/314, 322; 331/34; 307/261, 268; 328/178, 187; 455/102, 108

[56] References Cited

U.S. PATENT DOCUMENTS 3,975,675  8/1976  Dunand et al. ...................... 324/312
4,070,611  1/1978  Ernst .................................... 324/312
4,319,190  3/1982  Brown ................................. 324/309
4,486,708 12/1984  Macovski ............................ 324/309
4,506,222  3/1985  Edelstein et al. .................. 324/309
4,521,749  6/1985  Lockhart ............................ 455/108
4,540,958  9/1985  Neyens et al. ...................... 455/102

OTHER PUBLICATIONS

Abstracts, 17th Experimental NMR Conference, "Chirp Pulse NMR Spectroscopy", J. Delayre et al, Apr. 1976, pp. 5–9.

*Primary Examiner*—Stewart J. Levy
*Assistant Examiner*—Kevin D. O'Shea
*Attorney, Agent, or Firm*—Robert T. Mayer; Algy Tamoshunas

[57] ABSTRACT

The method and device for NMR Fourier zeugmatography utilizes amplitude-modulated r.f. pulses (90° and 180° pulses) for the excitation of nuclear spins and the generating of nuclear spin echo signals. For three-dimensional Fourier zeugmatography, r.f. pulse having a large bandwidth (for example 10–50 kHz) are desired. The use of amplitude-modulated signals then implies an undesirably high peak power of the r.f. generator. In accordance with the invention, use is made of a frequency-modulated signal which can have a substantially constant amplitude and which preferably covers the desired frequency spectrum at a uniform speed.

28 Claims, 5 Drawing Figures

METHOD AND DEVICE FOR DETERMINING AN NMR DISTRIBUTION IN A REGION OF A BODY

The invention relates to a method of determining an NMR distribution in a region of a body which is situated in a steady, uniform magnetic field, including the steps of:

(a) generating an r.f. electromagnetic pulse in order to generate a nuclear spin resonance signal,
(b) then taking, after a preparation period, a group of signal samples of the nuclear spin resonance signal by sampling during a measurement period,
(c) then repeating, each time after a waiting period, the steps (a) and (b) a number of times in order to obtain several (n') groups of (n) signal samples each, from which, after signal transformation thereof, an image of the NMR distribution is determined.

The invention also relates to a device for determining an NMR distribution in a region of a body, comprising:

(a) means for generating a steady, uniform magnetic field,
(b) an r.f. oscillator and an r.f. coil for generating r.f. electromagnetic radiation,
(c) means for generating a gradient magnetic field,
(d) sampling means for sampling a resonance signal generated by the means specified in the paragraphs (a) and (b),
(e) processing means for processing the groups of signal samples supplied by the sampling means, an image of an NMR distribution thus being determined, and
(f) control means for controlling the means specified in the paragraphs (b) to (e) for generating, conditioning, sampling and processing the groups of signal samples.

Such a method (also referred to as NMR tomography) and device are known from Netherlands Patent Application No. NL-A-82.03519 which corresponds to U.S. Pat. No. 4,527,124. According to such a method, a body to be examined is exposed to a strong, steady, uniform magnetic field Bo whose field direction coincides, for example, with the z-axis of a Carthesian coordinate system (x, y, z). The steady magnetic field Bo causes a slight polarization of the nuclear spins present in the body and enables a precessional motion of nuclear spins to occur about the direction of the magnetic field Bo. After the application of the magnetic field Bo, a preferably 90° pulse of r.f. electromagnetic radiation is generated (with an angular frequency $\omega = \gamma \cdot Bo$, in which $\gamma$ is the gyromagnetic ratio and Bo is the intensity of the magnetic field) in order to rotate the direction of magnetization of the nuclei present in the body through an angle (90°). After termination of the 90° pulse, the nuclear spins will start to perform a precessional motion about the field direction of the magnetic field Bo, thus generating a resonance signal (FID signal). Using the gradient magnetic fields $G_x$, $G_y$, $G_z$, whose field direction coincides with that of the magnetic field Bo, a total magnetic field $B = Bo + x \cdot G_x + y \cdot G_y + z \cdot G_z$ can be generated whose intensity is location-dependent, because the intensity of the gradient magnetic fields $G_x$, $G_y$, $G_z$ has a gradient in the x, the y, and the z direction, respectively.

After the 90° pulse, a field $G_x$ is applied for a period of time $t_x$ and subsequently a field $G_y$ for a period of time $t_y$, so that the precessional motion of the excited nuclear spins is influenced in a location-dependent manner. After this preparation phase (i.e. after $t_x + t_y$), a field $G_z$ is applied and the FID signal (actually the sum of all magnetizations of the nuclei) is sampled at $N_z$ measurement instants during a period of time $t_z$. This measurement procedure is subsequently repeated $1 \times m$ times, different values being used on each occasion for $t_x$ and/or $t_y$. Thus, $(N_z \times m \times 1)$ sampling signals are obtained which contain the information concerning the magnetization distribution in a region of the body in the x, y, z-space. The $1 \times m$ measured $N_z$ sampling signals are stored in a memory (in $N_z \times m \times 1$ memory locations), after which an image of the NMR distribution is obtained by a 3-D Fourier transformation of the sampling signals of the FID signals.

It will be apparent that it is alternatively possible, using selective excitation, to generate the FID signal of nuclear spins only in a 2-dimensional layer (having an orientation which can be selected at random) so that, for example, an FID signal need only be generated m times in order to obtain an image of the magnetization distribution in $m \times N_z$ points in the selected layer by means of a 2-dimensional Fourier transformation.

The r.f. pulses to be used in the known methods and devices serve to excite the nuclear spins in the desired region of the body. In the case of strong magnetic fields (for example, 1–2.5 T), pulses having a comparatively large bandwidth are required for this purpose, so that problems are encountered in the known methods and devices. For example, when doubling (tripling) of the bandwidth is required (the signal intensity of the various frequencies remaining the same throughout the band in order to rotate the nuclear spins through the same angle), the required amount of energy is doubled (tripled); moreover, the period of time during which the r.f. pulse is to be supplied must be reduced to one half (one third), so that a four (nine) times higher peak power will have to be supplied by the r.f. generator, which is a very serious drawback.

It is the object of the invention to provide a method and a device in which the doubling of the bandwidth of the r.f. pulse requires only a proportional increase of the peak power of the r.f. pulse. As a result a frequency generator can be used which is very attractive as regards performance and costs.

To this end, a method in accordance with the invention is characterized in that the r.f. electromagnetic pulse is a frequency-modulated pulse. In the method in accordance with the invention, the instantaneous r.f. signal passes through the desired frequency band, the various frequencies being searched one by one as if it were in order to be applied to the relevant object.

A preferred version of a method in accordance with the invention is characterized in that the frequency of the frequency-modulated pulse is a linear function of time. Such a method offers the advantage that the nuclear spins to be influenced by the various frequencies are all influenced for the same period of time, so that the r.f. pulse can always have substantially the same amplitude for successive frequencies.

It can be demonstrated that nuclear spins which are subject to different magnetic fields at different locations in the examination zone undergo different phase shifts under the influence of a frequency-modulated r.f. pulse. In the case of a linearly frequency-modulated r.f. pulse, this phase shift is inversely proportional to the rate of variation of the frequency, i.e. to the variation of the frequency per unit of time. This property can be used to compensate for the phase shifts affecting the evaluation of the echo signal in that the variation of the frequency of the r.f. pulses in relation to the unit of time is chosen so that the phase shifts imposed by the individual r.f. pulses on nuclear spins which are subject to different magnetic fields compensate for one another.

As has already been stated, these phase shifts are caused by the fact that the individual nuclei are subject to different magnetic fields at different locations in the body. Such differences can result undesirably from the inhomogeneity of the steady magnetic field and deliberately from the application of gradient magnetic fields. Because the phase shift is also proportional to the square of the difference between the nuclear spin resonance frequencies at the different locations in the examination zone and hence also proportional to the square of the difference between the magnetic field intensities at the relevant locations, in a further version of the method in accordance with the invention which can be used with gradient magnetic fields which are active during the r.f. pulses, the field intensity of the gradient fields active during the r.f. pulses and/or the variation of the frequency of the r.f. pulses in relation to the unit of time is chosen so that the pase shifts of the nuclear spins which are caused by the individual pulses compensate for one another.

The choice of the gradients of the gradient magnetic fields or the variations of the frequency per unit of time depends on the relevant examination method. For a method of recording spin echo signals where a gradient magnetic field is active during a 90° pulse and during a 180° pulse, a gradient magnetic field is active which extends in the same direction, in accordance with the invention the gradient fields or the frequency variations per unit of time are chosen so that the relation $$g_1^2/\beta_1 = 2g_2^2/\beta_2$$

is satisfied, in which $g_1$, $g_2$ are the gradients of the gradient magnetic field during the first and the second r.f. pulse, respectively, and $\beta_1$, $\beta_2$ are the frequency variations in relation to the unit of time during the first and the second r.f. pulse, respectively.

The situation is different, however, when a so-called stimulated echo is to be recorded. According to this method which is known from the articles by E. L. Hahn in "Physical Review" 80, Nov. 15, 1950, p. 580 ff and J. E. Tanner in "The Journal of Chemical Physics" 52, No. 5, Mar. 1, 1970, pp. 2523–2526, three r.f. pulses are generated in succession, at least the first two pulses thereof being preferably 90° pulses. The stimulated echo signal then reaches its maximum at an instant after the third r.f. pulse which corresponds to the duration of the time interval between the first two r.f. pulses. In such a method the described undesirable phase shifts can be eliminated by choosing the gradient fields and the frequency-modulation of the pulses in such a manner that the relation $$g_1^2/\beta_1 = g_2^2/\beta_2 + g_3^2/\beta_3$$

is satisfied, in which $g_1$, $g_2$, $g_3$ correspond to the gradients of the gradient magnetic field during the first, the second and the third r.f. pulse, respectively, and $\beta_1$, $\beta_2$, $\beta_3$ correspond to the frequency variations in relation to the unit of time during the first, the second and the third r.f. pulse, respectively.

A device in accordance with the invention is characterized in that the r.f. oscillator of the device also comprises frequency-modulation means for generating an oscillator frequency which varies as a function of time.

A preferred embodiment of a device in accordance with the invention is characterized in that the r.f. oscillator comprises a constant-frequency oscillator and a quadrature modulator, the output of the constant-frequency generator being connected to the r.f. coil via the quadrature modulator.

Some embodiments in accordance with the invention will be described in detail hereinafter with reference to the drawing; therein;

Figure 1:
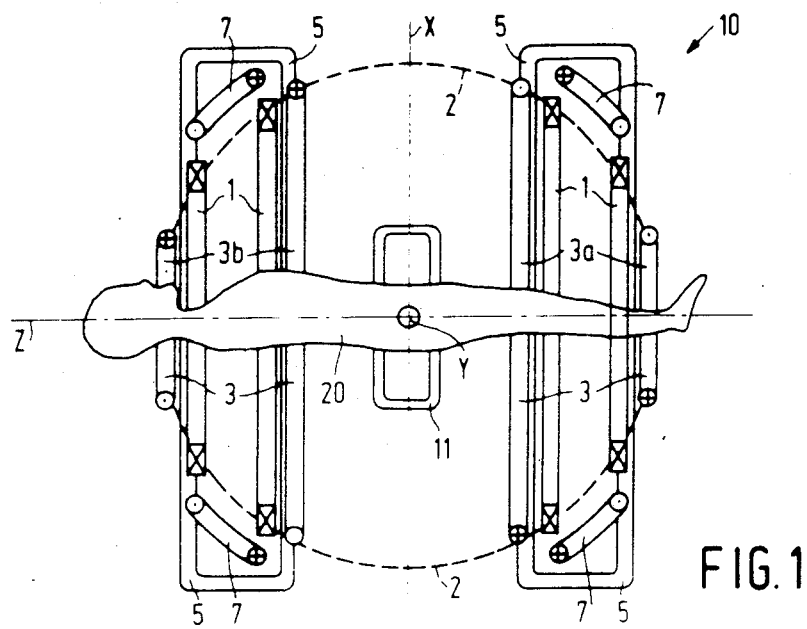
FIG. 1 shows a coil system which forms part of a device in accordance with the invention.

FIG. 1 shows a coil system 10 which forms part of a device used for determining an NMR distribution in a region of a body 20. This region has a thickness of, for example $\Delta z$ and is situated in the x-y plane of the coordinate system (x, y, z) shown. The y-axis of the system extends upwards perpendicularly to the plane of drawing. The coil system 10 generates a uniform, steady magnetic field parallel to the z-axis, three gradient magnetic fields $G_x$, $G_y$ and $G_z$ having a field direction parallel to the z-axis and a gradient direction parallel to the x, y and z axis, respectively, and an r.f. magnetic field. To achieve this, the coil system 10 comprises a set of main coils 1 for generating the steady uniform main magnetic field Bo having an intensity of between 0.2 and 2 Tesla. The main coils 1 may be arranged, for example, on the surface of a sphere 2 whose center is situated at the origin O of the carthesian coordinate system, (x, y, z) shown, the axes of the main coils 1 being coincident with the z-axis.

The coil system 10, furthermore, comprises, for example, four coils $3_a$, $3_b$ which are arranged on the same spherical surface and which generate the gradient magnetic field $G_z$. To achieve this, a first set $3a$ is excited by a current in the opposite sense with respect to the current direction in the second set $3b$. This is denoted by ⊙ and ⊗ in the Figure wherein, ⊙ means a current entering the section of the coil 3 and ⊗ means a current leaving the section of the coil.

The coil system 10 comprises, for example four rectangular coils 5 (only two of which are shown) of four other coils such as, for example "Golay coils", for generating the gradient magnetic field $G_y$. In order to generate the gradient magnetic field $G_x$, use is made of four coils 7 which have the same shape as the coils 5 and which have been rotated through an angle of 90° about the z-axis with respect to the coils 5. FIG. 1 also shows a coil 11 for generating and detecting an r.f. electromagnetic field.

Figure 2:
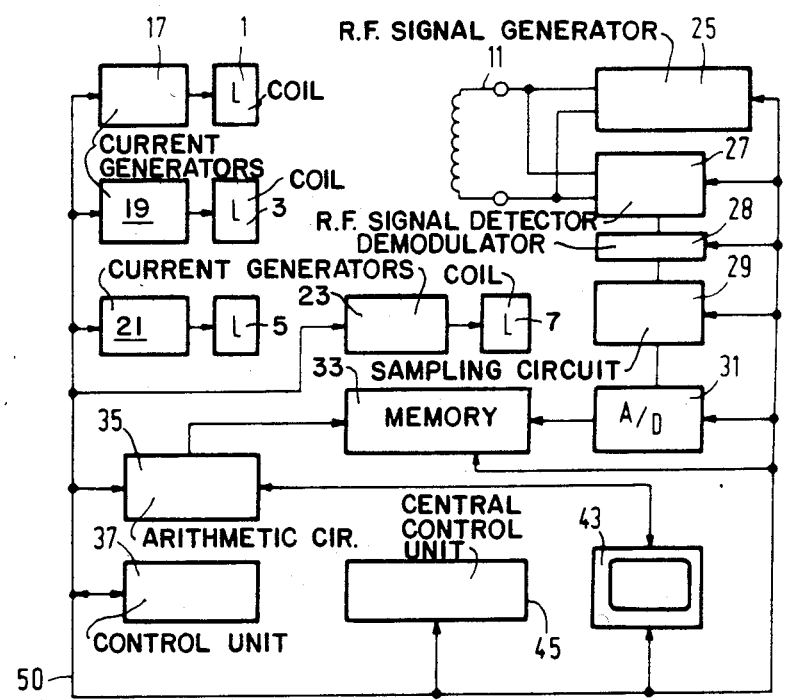
FIG. 2 shows a device for performing the method in accordance with the invention.

FIG. 2 shows a device 15 for performing a method in accordance with the invention. The device 15 comprises coils 1, 3, 5, 7 and 11 which have already been described with reference to FIG. 1, current generators 11, 19, 21 and 23 for energizing the coils 1, 3, 5 and 7, respectively, and an r.f. signal generator 25 for energizing the coil 11. The device 15 also comprises an r.f. signal detector 27, a demodulator 28, a sampling circuit 29, processing means such as an analog-to-digital converter 31, a memory 33 and an arithmetic circuit 35 for performing a signal transformation (for example, a Fourier transformation), a control unit 37 for controlling the sampling instants, and also a display device 43 and central control means 45 whose functions and relationships will be described in detail hereinafter.

The described device 15 is used to perform a method of determining the NMR distribution in a body 20 as described above. The method comprises several steps. Before "measurement" commences, the nuclear spins present in the body are resonantly excited. Resonant excitation of the nuclear spins is achieved by activation of the current generator 17 by the central control unit 45, thus energizing the coil 1. A steady and uniform magnetic field Bo is thus generated. Furthermore, the r.f. generator 25 is briefly switched on, so that the coil 11 generates an r.f. electromagnetic field. The nuclear spins in the body 20 can be excited by the applied magnetic fields, the excited nuclear magnetization then taking up a given angle, for example 90° (90° r.f. pulse) with respect to the uniform magnetic field Bo. The location where and which nuclear spins will be excited depends inter alia on the intensity of the field Bo, on any gradient magnetic field to be applied, and on the angular frequency $\omega$ of the r.f. electromagnetic field, because the equation $\omega=\gamma$. Bo must be satisfied, in which $\gamma$ is the gyromagnetic ratio (for free protons, for example H$_2$O protons, $\gamma/2\pi = 42.576$ MHz/T). After an excitation period, the r.f. generator 25 is switched off by the central control means 45. The resonant excitation is always performed at the beginning of each measurement cycle. For some methods of operation r.f. pulses are also induced into the body during the measurement cycle. These r.f. pulses can be, for example, 180° r.f. pulses which are periodically induced into the body. The latter is referred to as "spin echo". Spin echo is inter alia described in the article by I. L. Pykett "NMR Imaging in Medicine", published in Scientific American, May 1982.

During a next step, sampling signals are collected, for which purpose use may be made of the gradient fields generated by the generators 19, 21, 23, respectively, under the control of the central control means 45, depending on the nature of the measurement (for example, nuclear spin density distribution, flow velocity distribution, location-dependent spectroscopy). The detection of the resonance signal (referred to as the FID signal) is performed by switching on the r.f. detector 27, the demodulator 28, the sampling circuit 29, the analog-to-digital converter 31 and the control unit 37. The FID signal appears as a result of the precessional motion of the nuclear magnetizations about the field direction of the magnetic field Bo which is caused by r.f. excitation pulse. This nuclear magnetization induces an induction voltage in the detection coil whose amplitude is a measure of the nuclear magnetization.

The analog, sampled FID signals originating from the sampling circuit 29 are digitized (converter 31) and stored in a memory 33. After expiration of the measurement period, the central control unit 45 deactivates the generators 19, 21 and 23, the sampling circuit 29, the control unit 37 and the analog-to-digital converter 31. The sampled FID signals are stored in the memory 33 and are converted, by way of Fourier transformation, into an image of the nuclear magnetization distribution generated in the region of the body in which the nuclear spins have been correctly excited. The region of the body in which nuclear spins are excited is determined by the applied magnetic field (the main field Bo and a gradient magnetic field G present) and by the frequency (frequencies) of the r.f. pulse. It holds good that $\omega = \gamma(Bo + G_z \cdot z)$ (in the presence of a gradient magnetic field in the z-direction) or that $z = (\omega - \gamma \cdot Bo)/(\gamma \cdot G_z)$. When the r.f. pulse has a bandwidth $\Delta\omega$, $\Delta z = \Delta\omega/\gamma \cdot G_z$. When $\omega_o$ is the central frequency in the spectrum of the r.f. pulse, nuclear spins will be excited in a "slice" having a thickness $\Delta z$ which symmetrically encloses the central plane $z = (\omega_o - \gamma \cdot Bo)/(\gamma \cdot G_z)$. When the main field Bo has an intensity 2 T and a homogeneity of 25 ppm, a gradient magnetic field intensity of 5 mT/m will be required for restricting the geometrical distortion to 1 cm. For the excitation of a slice $\Delta z$ having a thickness of 1 cm, an r.f. pulse having a bandwidth of 2 kHz will be required for the given gradient magnetic field intensity. When three-dimensional Fourier Zeugmatography is used (offering a three-dimensional image), thicker slices should be excited. For example, for a slice having a thickness of 10 cm an r.f. pulse having a bandwidth of 20 kHz will be required. In accordance with the present state of the art, this would require an r.f. generator delivering a hundred-fold peak power. The foregoing can be illustrated as follows: the Fourier transform of a pulse p(t) is F(p(t)) = P($\omega$). Increasing the bandwidth by a factor a is equivalent to reducing the frequency scale by a factor a, so that the Fourier transform can be written as P($\omega$/a) instead of P($\omega$). The Fourier back-transform $F(P(\omega/a)) = |a| \cdot p(at)$. Thus, the pulse is contracted by a factor a in the time domain and the amplitude of the pulse is increased by the same factor.

For a frequency-modulated r.f. pulse, the r.f. generator in the above embodiment need be capable of supplying only a ten-fold peak power. It will also be understood that the frequency is preferably a linear function of time. The instantaneous frequency of the r.f. pulse is $\omega(t) = \omega_o + \beta \cdot t (\omega_o, \beta$ are constant values), so that the phase of the r.f. pulse equals $\phi(t) = \omega_o(t - t_o) + \frac{1}{2}\beta(t^2 - t_o^2)$. When the frequency of the r.f. pulse varies about the Larmor frequency ($\omega_o = \gamma \cdot Bo$) of the system, the phase in a coordinate system which rotates with the angular frequency $\omega_o$ will be $\phi(t) = \frac{1}{2} \cdot \beta(t^2 - t_o^2)$. When the phase at $t = t_o$ is assumed to be 0, so that $\phi(t) = \frac{1}{2} \cdot \beta t^2$, an r.f. pulse could appear as $S(t) = A \cdot \exp(\frac{1}{2} i\beta t^2)$, the amplitude A being constant. The Fourier transform of S(t) is $S(\omega) = A\sqrt{i/\beta} \cdot \exp(-i\omega^2/2\beta)$, having a frequency spectrum of from $-\infty$ to $+\infty$. When a rectangular shape is chosen for S($\omega$), the time function S(t) will be a "sin (x)/x-like" function which extends in the time domain from $-\infty$ to $+\infty$. For the frequency spectrum S($\omega$), preferably a rectangular shape is chosen, the edges being formed by Gaussian curves. The time signal is then formed by a squarewave-like pulse whose leading edge increases exponentially; the signal reaching an ultimate value via a decaying oscillation, while the trailing edge is a mirror image of the leading edge. The foregoing is merely one of the various waveforms which can be used and which satisfy the requirement that they must be very well defined in the time domain as well as the frequency domain. The signal waveforms can be determined as follows:

(a) Calculate the necessary bandwidth $\Delta\omega$ from the desired slice thickness and from the gradient magnetic field intensity (for the selective excitation). When hydrogen proton densities are imaged (at 80 MHz), the bandwidths amount to from 500 Hz to 50 kHz.

(b) Select the pulse duration (for example, from 1 to 10 ms). The longer the selected pulse duration, the lower the required peak power will be. However, in the case of an excessively long pulse duration, the effect of the T2 relaxation time will become noticeable.

(c) Determine the frequency variation rate $\beta$ from the bandwidth and the pulse duration (when the nuclear spin echo technique is used, $\beta$ should be approximately twice as high for 180° pulses in comparison with $\beta$ for the 90° pulses as will be described hereinafter).

(d) Select a function (envelope) of the frequency spectrum, such as $$f(W) = \begin{cases} 1 & W - W_o \leq \Delta W \\ \exp(-\frac{1}{2}(|W - W_o| - \Delta W)^2 b^2) & \text{for } W - W_o > \Delta W \end{cases}$$

in which, for example $\Delta\omega = 2\cdot\pi 10$ kHz and $b = 2\pi\cdot 500$ Hz.

(e) Calculate the complex time signal from the above data for the control of the frequency-modulated oscillator.

(f) Adjust the value of the r.f. pulse so that in the coordinate system which rotates at the angular frequency $\omega_o$ for a magnetic r.f. field $B_1(x')_t$ and $B_2(y')_t$ satisfy the following equations:
$\int \gamma\cdot(B_1(x')_t + iB_2(y')_t)dt = \pi/2$ for a 90° pulse, and
$\int\cdot(B_2(x')_t + iB_2(y')_t)dt \approx 1.3\pi$ for a 180° pulse, in which $\gamma$ is the gyromagnetic ratio.

Figure 3:
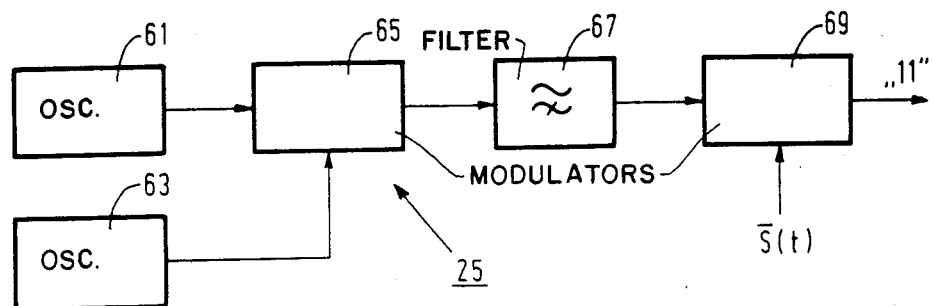
FIG. 3 shows an embodiment of an r.f. oscillator for a device in accordance with the invention.

FIG. 3 shows a first embodiment of an r.f. oscillator 25 (generator) for a device 15 in accordance with the invention. The oscillator 25 comprises a constant-frequency oscillator 61, an l.f. oscillator 63, an amplitude modulator 65, a frequency filter 67 and a further amplitude modulator 69. The signal having the frequency $f_o$ which is generated by the oscillator 61 is applied to the modulator 65, together with the signal f which is generated by the oscillator 63 and whose frequency increases (preferably linearly) from $f_1$ to $f_2$. As is known, the modulator 65 supplies an output signal comprising signals having the sum frequency $f_o + f$ (upper band) and the difference frequency $f_o - f$ (lower band). One of the signals is conducted by the filter 67. Thus, the filter 67 conducts either the frequencies above $f_o$ or the frequencies below $f_o$. The output signal of the filter 67 is applied to the r.f. coil 11 (FIGS. 1 and 2) via an amplitude modulator 69 (for example, a controllable amplifier).

The variation of the frequency from $f_1$ to $f_2$ determines the bandwidth of the generated r.f. signal. The modulator 65 (which may also be, for example a four-quadrant multiplier) supplies an r.f. signal having a "constant" amplitude which is multiplied by the modulator 69 by the time signal $\bar{s}(t)$ (the envelope of the r.f. pulse). This time signal is determined by $\bar{s}(t) = \sqrt{s_1^2(t) + s_2^2(t)}$, in which $s_1(t)$, $s_2(t)$ are the real and the imaginary signal, respectively, of the Fourier transform of the function selected in the frequency spectrum. It will be apparent that the time signal $\bar{s}(t)$ should vary in synchronism with the frequency variation (oscillator 63).

Figure 4:
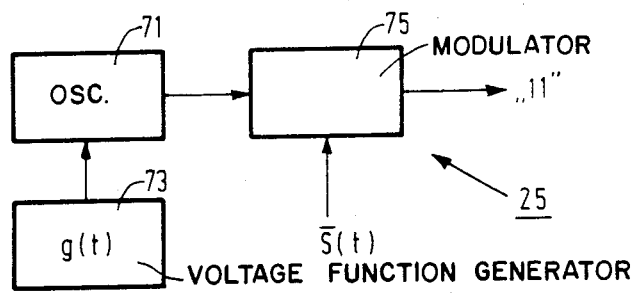
FIG. 4 shows a further embodiment of an r.f. oscillator for a device in accordance with the invention.

FIG. 4 shows a further embodiment of an r.f. oscillator 25 for a device 15 in accordance with the invention. The r.f. oscillator 25 comprises a voltage-controlled oscillator 71 which is controlled by a voltage function generator 73. When the frequency generated by the oscillator 71 is a linear function of the control voltage, the function generator 73 generates a delta voltage which, of course, must be synchronized with the time signal $\bar{s}(t)$ and which controls an amplitude modulator 75 in order to form the desired r.f. pulse. The output of the amplitude modulator 75 is connected to the r.f. coil 11.

Figure 5:
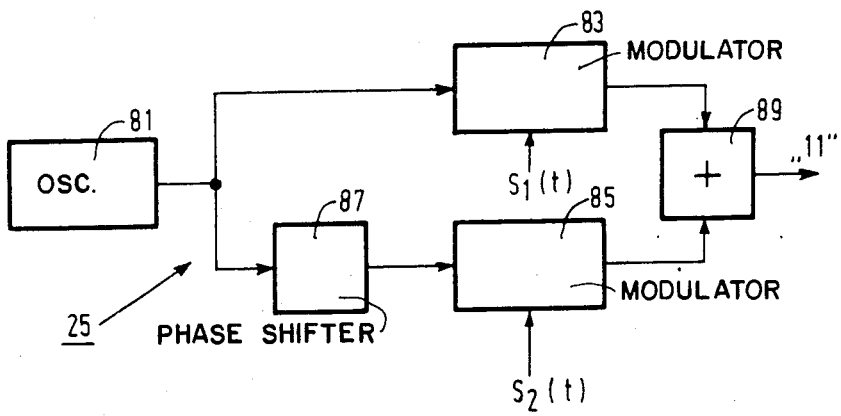
FIG. 5 shows a preferred embodiment of an r.f. oscillator for a device in accordance with the invention.

FIG. 5 shows a preferred embodiment of an r.f. oscillator 25 for a device 15 (FIGS. 1 and 2) in accordance with the invention. The r.f. oscillator 25 comprises a constant-frequency oscillator 81 and quadrature modulator which comprises a 90° phase shifter 87, two amplitude modulators 83 and 85, and an adder circuit 89. The r.f. signal ($\cos \omega t$) generated by the oscillator 81 is applied to the amplitude moulator 85 via the 90° phase shifter 87. The amplitude modulators 83 an 85 receive the time signals $s_1(t)$ and $s_2(t)$, respectively, $s_1(t)$ and $s_2(t)$ being the real and the imaginary time signal, respectively, of the Fourier transform of the function selected in the frequency spectrum. The adder circuit 89, which in this case need comprise only a differential amplifier, receives and combines the output signals of the two modulators 83 and 85. The output signal of the adder circuit 89 equals S(t)

$$= s_1 \cos\omega t - s_2(t) \sin\omega t.$$
$$= Re((s_1(t) + is_2(t))\exp i\omega t)$$

and is applied to the r.f. coil 11.

When use is made of frequency-modulated exicitation pulses (90° pulses and/or 180° echo pulses), a situation arises in which the excited nuclear spins exhibit a mutual phase difference which is a squarelaw function of the local angular frequency $\Delta\omega$, as will be described hereinafter. This phenomenon is very disturbing notably in the case of selective excitation, because it occurs in a direction transversely of the selected slice. The squarelaw dependency of the phase differences as a function of the distance from a central plane in a selected slice renders a resonance signal (FID or spin echo signal) generated by the nuclear spins thus excited unsuitable for use for the imaging of the nuclear magnetization distribution in the excited slice.

The described phenomenon can be understood as follows. An FM pulse (90° or 180° pulse) as used for excitation is obtained by means of an r.f. signal whose angular frequency varies as a linear function of time from $\omega_o - \Delta\omega$ to $\omega_o + \Delta\omega$ during the pulse duration from $-\Delta t$ to $+\Delta t$. The nature of the FM pulse, however, is such that a nuclear spin which resonates at the angular frequency $\omega_1$ (due to, for example, a gradient field or main field inhomogeneity) is effectively influenced only during a very short period of time from $(t_1 - \epsilon_t$ to $t_1 + \epsilon_t)$. This is the case when the angular frequency $\omega$ of the FM pulse "passes through" said angular frequency $\omega_1$ of the nuclear spin. The period of time $2\cdot\epsilon_t$ is much shorter than the entire pulse duration $2\Delta t$; consequently, it is assumed that in this case the desired 90° or 180° reversal of the orientation of the nuclear spins occurs at the angular frequency $\omega_1$ of the FM pulse, exactly at the associated instant $t_1$. Two effects have influenced the phase of the nuclear spins after termination of the FM pulse: a the phase of the FM pulse itself at the instant $t_1$, and b the instant $t_1$ at which the nuclear spins are "reversed".

The effect a means that in the case of a 90° pulse the nuclear spins (as from the z axis) are rotated with a given phase angle in the x-y plane, and that in the case of a 180° pulse the nuclear spins are mirror-imaged with respect to a line with a given phase. It is assumed that the FM signal is shaped as follows:

$$\cos(\omega_o t + \beta t^2) \text{ for } -\Delta t \leq t \leq \Delta t.$$

The rate of change of the angular frequency $\beta$ satisfies:

$$\beta = \Delta\omega/2\Delta t.$$

When the angular frequency $\omega_1$ is reached at the instant $t_1$, the following is applicable:

$$\omega_1 = \omega_o + 2\beta t_1$$

and $$t_1 = (\omega_1 - \omega_o)/2\beta.$$

When a time difference $\tau$ is taken with respect to the instant $t_1$ (so that $t = t_1 + \tau$), the following if applicable:

$$\cos(\omega_o t + \beta t^2) = \cos(\omega_1 \tau + \beta \tau^2 + \omega_o t_1 + \beta t_1^2).$$

It follows that in a rotating system (rotating at the angular frequency $\omega_o$) the pulse whereto the nuclear spins which resonate at the angular frequency $\omega$ have been subjected exhibits a phase shift $\rho\omega(1)$ with respect to the pulse which influences the nuclear spins resonating at an angular frequency $\omega_o$, said shift amounting to:

$$\rho\omega(1) = (\omega - \omega_o)^2/4\beta.$$

The effect b is caused by the selection gradient field which is usually present in the case of 90° or 180° pulses for the selective excitation of a slice in a body and which induces angular frequency differences for different nuclear spins and which is applied for a period of time of from $t_o$ to $t_2$. A nuclear spin which resonates at the angular frequency $\omega_1$ is thus influenced by the gradient field for a period of time $t_1-t_o$ before the nuclear spin "reverses" and for a period of time $t_2-t_1$ after the reversal of the nuclear spin. In the case of a 90° pulse, the nuclear spin is not influenced by a gradient field. However, it is influenced during a period $t_2-t_1$; this causes a phase shift $\rho^{(2)}$ (with respect to nuclear spins resonating at the angular frequency $\omega_o$): $\rho^{(2)}$ $$= (t_2 - t_1)(\omega_1 - \omega_0)$$

$$= t_2(\omega_1 - \omega_0) - (\omega_1 - \omega_0)^2/2\beta.$$

The total dephasing in the case of a 90° pulse for a nuclear spin resonating at an angular frequency $\omega_1$ thus equals a linear term plus $$\phi\omega^{(90)} = -\frac{(\omega_1 - \omega_0)^2}{4\beta}.$$

For a 180° pulse the following is applicable: the phase of the 180° pulse itself equals $\rho\omega_1 = (\omega_1 - \omega_o)^2/4\beta$ at the instant $t_1$ which also represents the phase or the angle of the mirror line in the x-y plane with respect to which the nuclear spins are mirrored by the 180° pulse. This angle, when unequal to zero, causes an additional phase shift in the phase of the nuclear spins which amounts to twice the value of said angle. Therefore, the dephasing by a 180° pulse is determined by:

$$\phi\omega^{(180)} = -\frac{(\omega_1 - \omega_0)^2}{2\beta}.$$

The same reasoning, of course, holds good for the frequency shift due to (main) field inhomogeneities.

A further consideration of the squarelaw terms $$\phi\omega^{(90)} = -\frac{(\omega - \omega_0)^2}{4\beta} \text{ and } \phi\omega^{(180)} = -\frac{(\omega - \omega_0)^2}{2\beta}$$

taking into account the fact that the contribution of the term $\rho\omega^{(90)}$ to the phase of the nuclear spins is inverted by a 180° pulse, leads to the conclusion that the squarelaw terms will neutralize one another when the rate of variation of the angular frequency $\beta_{180}$ of a 180° pulse is twice as high as the rate of the angular frequency variation $\beta_{90}$ of the 90° pulse. A further method of making the squarelaw terms $\rho\omega_1^{(90)}$ and $\rho\omega^{(180)}$ compensate one another when use is made of selective gradient fields, is to make the gradient field intensity during the 180° pulse a factor $\sqrt{2}$ smaller than the gradient field intensity during the 90° pulse.

Although both methods are effective, only the odd echo signals can be used for image reconstruction, because the squarelaw dependency caused by the 90° pulse is compensated for by the first 180° pulse, the squarelaw dependency caused by a second ($2 \cdot n^e$) 180° pulse being eliminated only by the third ($2 \cdot n + 1^e$) 180° pulse. Hereinafter a solution will be given to the described problem, said solution utilizing a "composite" 180° FM pulse. An optimum 180° pulse which is centered about the instant $\tau$ brings all nuclear spins which are in phase at the instant $t=0$ in phase again at the instant $2\tau$. A sequence of three successive 180° FM pulses is proposed (I, II and III), the central pulse II thereof having half the rate of variation of the angular frequency with respect to the rate of variation of the angular frequency of the pulses I and III and a duration which is twice as long, its amplitude amounting to half the amplitude of the pulses I and III. Considering the described formule for the dephasing by the 180° pulse, it will be apparent that the overall dephasing effect of the composite 180° pulse has a squarelaw component which equals zero. The squarelaw contribution of the pulse I is inverted twice (by the pulses II and III) and the squarelaw contribution by the pulse II is inverted once. Consequently, the overall effect of the squarelaw contributions is:

$$\phi\omega^{comb.} = \phi\omega^I - \phi\omega^{II} + \phi\omega^{III}$$

$$= -(\omega - \omega_0)^2/2\beta + (\omega - \omega_0)^2/\beta - (\omega - \omega_0)^2/2\beta = 0.$$

It will be apparent that all echo signals can now be used for image reconstruction, the duration of the composite 180° FM pulse being much shorter than the period of time which would normally be required for generating an unusable and subsequently a usable echo signal. It will also be apparent that composite pulses can be formed which are composed of five, seven etc. 180° pulses, for which the sum of the square law contributions to the dephasing of the nuclear spins is zero. However, such composite 180° pulses will require more energy and will also dissipate more energy in an object ot be examined, which is undesirable notably when the object is a patient or an animal.

When a so-called stimulated echo signal is to be received after three successive r.f. pulses which have been linearly frequency-modulated in time, the relation $$g_1^2/\beta_1 = g_2^2/\beta_2 + g_3^2/\beta_3 \qquad (7)$$

must be satisfied when the undesirable phase shifts between nuclear spins at different locations in the examination zone are to be avoided. Therein, $g_1$, $g_2$, $g_3$ are the gradients of the gradient magnetic fields during the first, the second and the third r.f. pulse, respectively, and $\beta_1$, $\beta_2$, $\beta_3$ are the frequency variations in relation to the unit of time during the first, the second and the third r.f. pulse, respectively. Compensation can then be achieved in various ways. It is achieved, for example when the frequency variation of the second and the third pulse amounts to twice the frequency variation of the first pulse. Alternatively, the gradient of the gradient magnetic field during the first r.f. pulse is a factor $\sqrt{2}$ larger than the gradient during the second as well as the third r.f. pulse.

Finally, it is also possible to perform amplitude modulation for one of the three pulses and linear frequency modulation in time only for the other two pulses. This means that the frequency variation $\beta$ per unit of time is infinite for the relevant pulse.

For example, when the first r.f. pulse is amplitude modulated, the desired phase shift compensation will be obtained if at least the gradients $g_2$ and $g_3$ during the second and the third r.f. pulse are equal and the frequency variations $\beta_2$ and $\beta_3$ per unit of time have the same value but an opposite sign, i.e. if the frequency varies at the same rate during the pulses, but increases during one pulse and decreases during the other pulse.

When instead the third (or the second) pulse is amplitude modulated, the desired phase shift compensation will be achieved if the gradients $g_1$, $g_2$ as well as the frequency variations $\beta_1$, $\beta_2$ per unit of time are equal.

What we claim is:

1. A method of determining an NMR distribution in a region of a body which is situated in a steady, uniform magnetic field, including the steps of:
   (a) generating a frequency modulated r.f. electromagnetic pulse in order to cause precessional motion of nuclear spins in said region of said body to thereby produce a nuclear spin resonance signal, said frequency modulated r.f. pulse having a substantially rectangular shape and leading and trailing edges which are determined by a Gaussian curve,
   (b) then taking, after a preparation period, a group of signal samples of the resonance signal by sampling during a measurement period,
   (c) then repeating, each time after a waiting period, the r.f. pulse generating and signal sample taking steps a plurality of times in order to obtain several of said groups of said signal samples each, from which, after signal transformation thereof, an image of the NMR distribution is determined.

2. A method as claimed in claim 1, wherein the frequency of the frequency-modulated pulse is a linear function of time.

3. A method as claimed in claim 1 or 2, including the step of generating a gradient field for the duration of the frequency-modulated pulse.

4. A method as claimed in claim 1 or 2 wherein the frequency-modulated pulse is generated by means of quadrature modulation.

5. A device for determining an NMR distribution in a region of a body, comprising:
   (a) means for generating a steady, uniform magnetic field,
   (b) means for generating a frequency modulated r.f. electromagnetic pulse having a substantially rectangular shape and leading and trailing edges which are determined by a Gaussian curve so as to produce a nuclear spin resonance signal in said region of said body,
   (c) means for generating a gradient magnetic field,
   (d) sampling means for sampling said resonance signal so as to obtain a group of signal samples,
   (e) processing means for processing the groups of signal samples supplied by the sampling means so as to produce an image of an NMR distribution, and
   (f) control means for controlling said pulse generating means, said gradient field generating means, said sampling means and said processing means.

6. The apparatus according to claim 5 wherein said pulse generating means includes an r.f. oscillator which supplies an r.f. signal, a frequency-modulation means coupled to said oscillator for modulating said r.f. signal so as to produce an r.f. output signal with a frequency which varies as a function of time.

7. A device as claimed in claim 6, wherein said r.f. oscillator is a voltage-controlled oscillator having a control input, and including a voltage function generator having an output which is connected to said control input.

8. A method of determining an NMR distribution in a region of a body which is situated in a steady, uniform magnetic field, said method comprising the steps of:
   (a) generating a frequency modulated, 90° r.f. electromagnetic pulse so as to cause nuclear spin in said region of said body to perform a precessional motion to thereby generate a nuclear spin resonance signal,
   (b) after a preparation period, generating a frequency modulated, 180° r.f. electromagnetic pulse in order to generate a nuclear spin echo signal,
   (c) during a measurement period, obtaining a group of signal samples of said spin echo signal after two successive r.f. pulses, the frequency of the r.f. pulses being varied in relation to time such that phase shifts imposed by the individual r.f. pulses on the nuclear spins which are subject to different magnetic fields compensate for one another,
   (d) then repeating, each time after a waiting period, said pulse generating and signal sample obtaining steps in order to obtain a plurality of said groups of said signal samples from which, after signal transformation thereof, an image of the NMR distribution is determined.

9. A method as claimed in claim 8 in which a gradient magnetic field is applied during each of said 90° and 180° pulses, said gradient fields extending in the same direction, and wherein the gradient fields or the frequency variations per unit of time satisfy the relation $$g_1^2/\beta_1 = 2g_2^2/\beta_2$$

wherein $g_1$, $g_2$ are the gradients of the gradient magnetic field during the 90° and the 180° r.f. pulse, respectively, and $\beta_1$, $\beta_2$ are the frequency variations in relation to time during the first of said two successive r.f.

pulses and the second of said two successive r.f. pulses, respectively.

10. A method as claimed in claim 8, including the step of applying a gradient field during the 90° pulse and during the 180° pulse.

11. A method as claimed in claim 10 wherein the field intensity of the 180° pulse is at least twice as high as the field intensity of the 90° pulse.

12. A method as claimed in claim 11, wherein the gradient field which is applied during the 90° pulse has a field intensity which is a factor $\sqrt{2}$ higher than the field intensity of the gradient magnetic field applied during the 180° pulse.

13. A device for determining an NMR distribution in a region of a body, comprising:
   (a) means for generating a steady, uniform magnetic field,
   (b) means for generating a frequency modulated r.f. electromagnetic pulse so as to produce a nuclear spin resonance signal in said region of said body, said pulse generating means including a constant frequency r.f. oscillator, a l.f. oscillator having an output for supplying a signal with a frequency which varies as a function of time, an amplitude modulator having a first input which is connected to an output of said r.f. oscillator and a second input which is connected to said output of said l.f. oscillator, a frequency filter having an input connected to an output of said modulator, and an r.f. coil which is coupled to an output of said filter,
   (c) means for generating a gradient magnetic field,
   (d) sampling means for sampling said resonance signal so as to obtain a group of signal samples,
   (e) processing means for processing said group of signal samples supplied by the sampling means so as to produce an image of an NMR distribution, and
   (f) control means for controlling said pulse generating means, said gradient field generating means, said sampling means and said processing means.

14. A device as claimed in claim 13, wherein said output of said filter is coupled to said r.f. coil via a further amplitude modulator.

15. A device as claimed in claim 14 wherein said further amplitude modulator is a controllable amplifier.

16. A device for determining an NMR distribution in a region of a body, comprising:
   (a) means for generating a steady, uniform magnetic field,
   (b) means for generating a frequency modulated r.f. electromagnetic pulse so as to produce a nuclear spin resonance signal in said region of said body, said pulse generating means including an r.f. coil, a constant frequency r.f. oscillator and a quadrature modulator, said r.f. oscillator having an output which is coupled to said coil via said modulator,
   (c) means for generating a gradient magnetic field,
   (d) sampling means for sampling said resonance signal so as to obtain a group of signal samples,
   (e) processing means for processing said group of signal samples supplied by the sampling means so as to produce an image of an NMR distribution, and
   (f) control means for controlling said pulse generating means, said gradient field generating means, said sampling means and said processing means.

17. A device as claimed in claim 16, wherein the quadrature modulator comprises a first amplitude modulator connected directly to the output of the r.f. oscillator and a second amplitude modulator connected to said output of said r.f. oscillator via a 90° phase shifter, said amplitude modulators having outputs which are connected to the r.f. coil via an adder circuit.

18. A device for determining an NMR distribution in a region of the body, comprising:
   (a) means for generating a steady uniform magnetic field,
   (b) means for generating frequency modulated r.f. electromagnetic pulses so as to produce a nuclear resonance signal in said region of the body,
   (c) means for generating gradient magnetic fields,
   (d) sampling means for sampling said resonance signal so as to obtain a group of signal samples,
   (e) processing means for processing the groups of signal samples supplied by the sampling means so as to produce an image of an NMR distribution, and
   (f) control means for controlling said pulse generating means, said gradient field generating means, said sampling means and said processing means, said pulse generating means being controlled by said control means so that said pulses generated thereby have different rates of change of angular frequency so as to compensate for mutual phase differences of the resonating nuclear spins.

19. A device determining an NMR distribution in a region of the body, comprising:
   (a) means for generating a steady uniform magnetic field,
   (b) means for generating frequency modulated r.f. electromagnetic pulses so as to produce a nuclear resonance signal in said region of the body,
   (c) means for generating a gradient magnetic field,
   (d) sampling means for sampling said resonance signal so as to obtain a group of signal samples,
   (e) processing means for processing the groups of signal samples supplied by the sampling means so as to produce an image of an NMR distribution, and
   (f) control means for controlling said pulse generating means, said gradient field generating means, said sampling means and said processing means, said gradient field generating means being controlled by said control means so that the field strength of successive gradient fields is different for different pulses so as to compensate for mutual phase differences of the resonating spins.

20. A method of determining an NMR distribution in a region of a body which is situated in a steady, uniform magnetic field, said method comprising the steps of:
   (a) generating a frequency modulated, 90° r.f. electromagnetic pulse so as to cause nuclear spin in said region of said body to perform a precessional motion to thereby generate a nuclear spin resonance signal,
   (b) after a preparation period, generating a frequency modulated, 180° r.f. electromagnetic pulse in order to generate a nuclear spin echo signal,
   (c) applying a gradient magnetic field during the time interval when each of said pulses is generated,
   (d) during a measurement period, obtaining a group of signal samples of said spin echo signal after at least two of said r.f. pulses are generated, the field intensity of the gradient fields applied during the r.f. pulses and/or the variation of the frequency of the r.f. pulses in relation to time being such that phase shifts of the nuclear spins which are caused by the individual pulses compensate for one another, (e) then repeating, each time after a waiting period, said pulses generating and signal sample obtaining steps in order to obtain a plurality of said groups of said signal samples from which, after signal transformation thereof, an image of the NMR distribution is determined.

21. A method as claimed in claim 20 wherein the samples of the echo signal are obtained after generation of two successive 90° pulses and at least one third pulse, including the step of applying a gradient field during the time interval when each of said said pulses is generated, which gradient fields extend in the same direction, and wherein the gradient fields and the frequency-modulation of the pulses satisfy the relation $$g_1^2/\beta_1 = g_2^2/\beta_2 + g_3^2/\beta_3$$

wherein $g_1$, $g_2$, $g_3$ correspond to the gradients of the gradient magnetic field during the first, the second and the third r.f. pulse, respectively, and $\beta_1$, $\beta_2$, $\beta_3$ correspond to the frequency variations in relation to time during the first, the second and the third r.f. pulse, respectively.

22. A method of determining an NMR distribution in a region of a body which is situated in a steady, uniform magnetic field, said method comprising the steps of:
    (a) generating a frequency modulated, 90° r.f. electromagnetic pulse so as to cause nuclear spin in said region of said body to perform a precessional motion to thereby generate a nuclear spin resonance signal,
    (b) after a preparation period, generating a frequency modulated, 180° r.f. electromagnetic pulse in order to generate a nuclear spin echo signal, the angular frequency variation as a function of time of the 180° r.f. pulse being approximately twice as large as the angular frequency variation of the 90° pulse and the 90° and 180° pulses having substantially the same frequency spectrum,
    (c) during a measurement period, obtaining a group of signal samples of said spin echo signal,
    (d) then repeating, each time after a waiting period, said pulse generating and signal samples obtaining steps in order to obtain a plurality of said groups of said signal samples from which, after signal transformation thereof, an image of the NMR distribution is determined.

23. A method as claimed in claim 22, including the step of applying a gradient field during the 90° pulse and during the 180° pulse.

24. A method as claimed in claim 23, wherein the field intensity of the 180° pulse is at least twice as high as the field intensity of the 90° pulse.

25. A method as claimed in claim 24, wherein the gradient field which is applied during the 90° pulse has a field intensity which is a factor $\sqrt{2}$ higher than the field intensity of the gradient magnetic field applied during the 180° pulse.

26. A method of determining an NMR distribution in a region of a body which is situated in a steady, uniform magnetic field, said method comprising the steps of:
    (a) generating a frequency modulated, 90° r.f. electromagnetic pulse so as to cause nuclear spin in said region of said body to perform a precessional motion to thereby generate a nuclear spin resonance signal,
    (b) after a preparation period, generating at least one frequency modulated composite 180° r.f. electromagnetic pulse in order to generate a first nuclear spin echo signal,
    (c) generating at least one further composite 180° r.f. pulse comprised of an odd number of 180° frequency modulated pulses whose sum of the square-law contributions to the dephasing of the nuclear spins is zero in order to generate at least one further nuclear spin echo signal,
    (d) during a measurement period, obtaining a group of signal samples of at least one of said first and further spin echo signals,
    (e) then repeating, each time after a waiting period, said pulse generating and signal sample obtaining steps in order to obtain a plurality of said groups of said signal samples from which, after signal transformation thereof, an image of the NMR distribution is determined.

27. A method as claimed in claim 26, wherein said further pulse consists of three 180° pulses, the angular frequency variation as a function of time of the first and the third 180° pulse being twice as large as the angular frequency variation as a function of time of the second 180° pulse, each of the three 180° pulses having the same frequency sweep.

28. A method as claimed in claim 27, wherein the amplitude of the second 180° pulse amounts to half the amplitude of the first and the third 180° pulse.

* * * * *